United States Patent [19]

Whatmore et al.

[11] Patent Number: 5,185,613
[45] Date of Patent: Feb. 9, 1993

[54] HYBRID STRUCTURES

[75] Inventors: Roger W. Whatmore, Milton Keynes; David J. Pedder, Oxford, both of Great Britain

[73] Assignee: GEC-Marconi Limited, Stanmore, England

[21] Appl. No.: 911,017

[22] Filed: Sep. 8, 1986

[51] Int. Cl.⁵ .................... H01Q 15/02; H01Q 19/09; H01Q 23/00
[52] U.S. Cl. .................................. 343/909; 343/753; 343/911 R
[58] Field of Search ............... 343/753, 789, 906, 909, 343/911 R; 333/99 R

[56] References Cited

U.S. PATENT DOCUMENTS

| 4,851,858 | 7/1989 | Frisch | 343/779 |
| 5,030,962 | 7/1991 | Rees | 343/700 MS |
| 5,041,839 | 8/1991 | Rees | 343/700 MS |

Primary Examiner—John B. Sotomayor
Attorney, Agent, or Firm—Jacobson, Price, Holman & Stern

[57] ABSTRACT

A hybrid structure comprising a lens 10, an antenna array 8 and a semiconductor microcircuit 2. The antenna array 8 is formed on a surface of the lens 10 or on a surface of a substrate 14 having substantially the same refractive index as the material of the lens 10. Metal bump bonds 6, 12 provide connections between the antenna array 8 and the semiconductor microcircuit 2.

9 Claims, 7 Drawing Sheets

BEFORE BONDING

FIG. 7(b)

AFTER BONDING (HAVING HEATED ABOVE SOLDER MELTING POINT)

FIG. 8(a)

BEFORE BONDING

FIG. 8(b)

AFTER BONDING (WITH APPLIED PRESSURE)

HYBRID STRUCTURES

FIELD OF THE INVENTION

The present invention relates to hybrid structures and more particularly to a hybrid structure comprising a lens, an antenna array and an integrated circuit.

BACKGROUND OF THE INVENTION

Figure 1A:
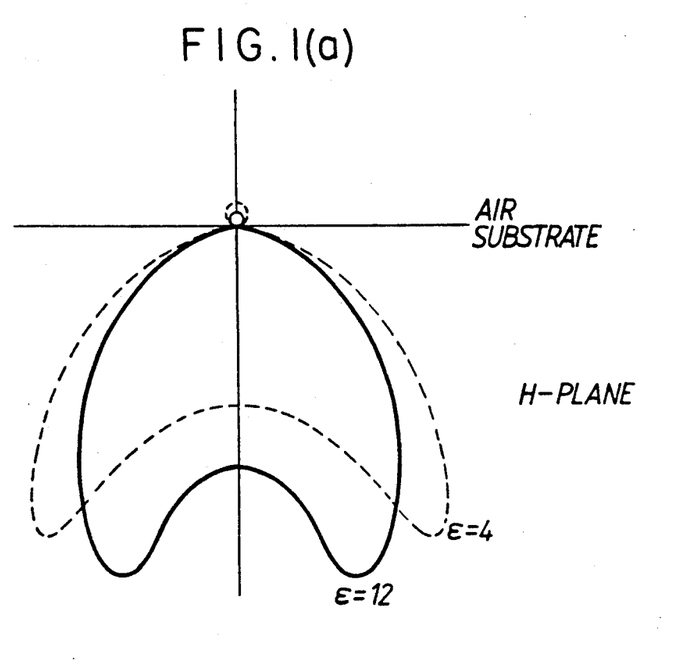
FIGS. 1a and 1b are known gain polar diagram for a resonant dipole antenna on a substrate.
Figure 1B:
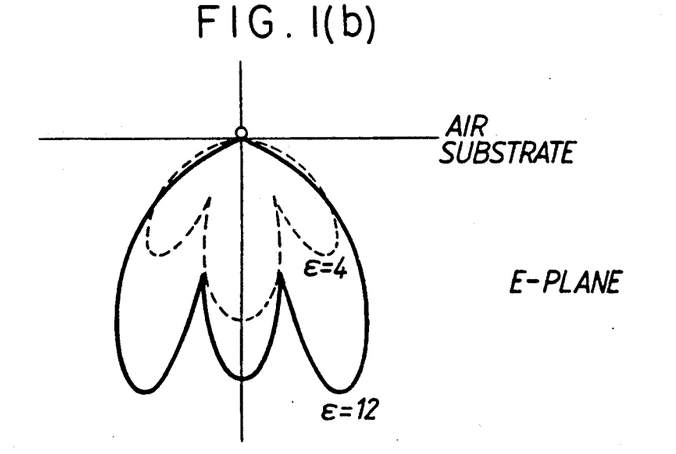
Figure 2:
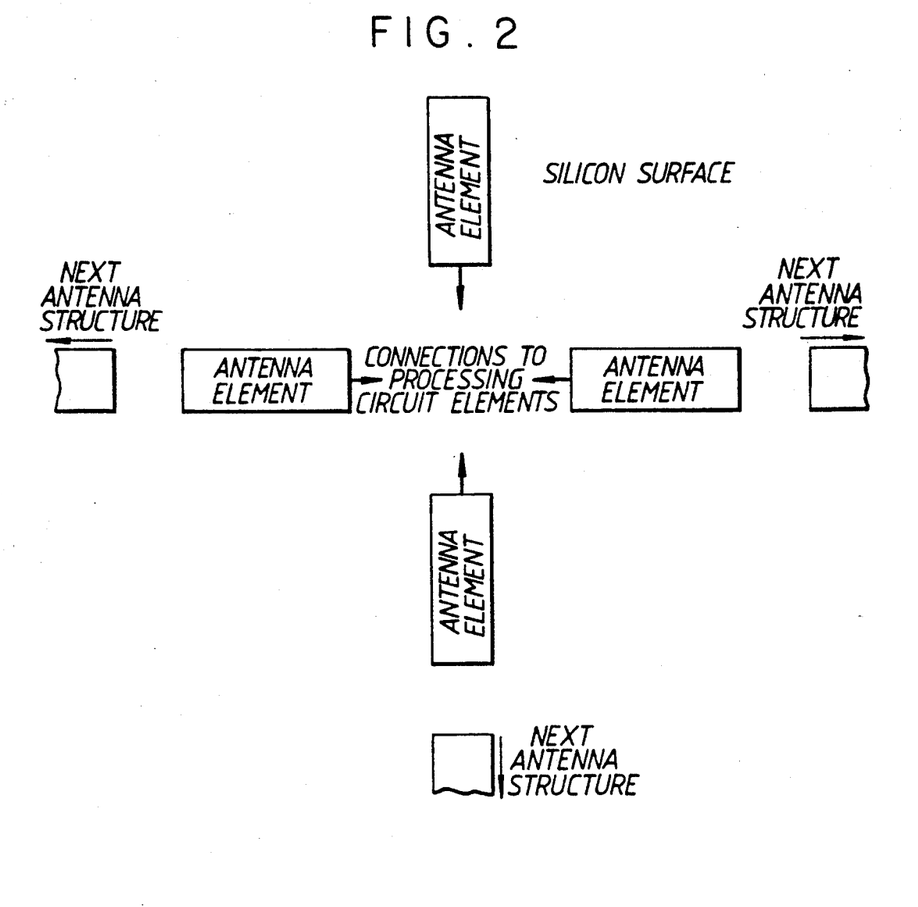
FIG. 2 is a layout plan for an antenna structure on a substrate.
Figure 3:
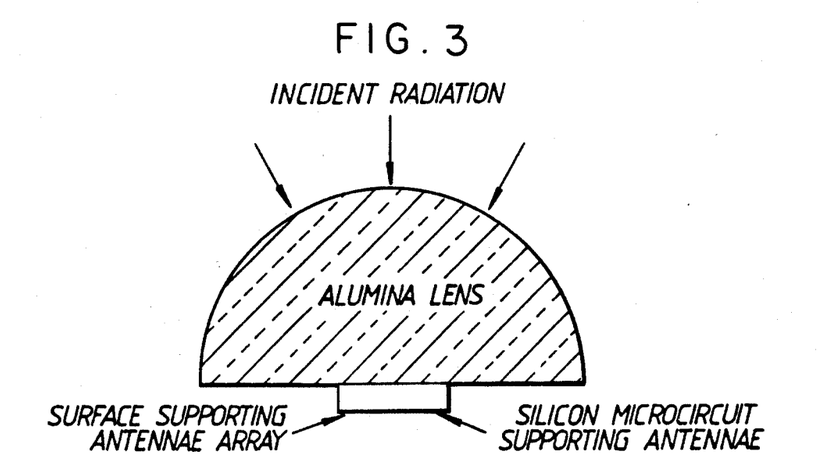
FIG. 3 is a schematic diagram illustrating a hybrid structure.

Dielectric lenses (which can be made from materials having refractive indices (n) varying from 2 to 9 or more) can be used to focus millimetre wave radiation onto antennae (dipoles or quadrupoles) which are fabricated on planar substrates. These antennae collect the radiation, which is detected and processed by active components fabricated as an integrated circuit on a slice of a semiconductor material, usually silicon but also possibly gallium arsenide. According to the theory taught by Brewitt-Taylor et al described in Electronics Letters (1981) 17 729-31, planar antennae fabricated upon a substrate of high refractive index (such as silicon) in contact with a medium of low refractive index (such as air) will exhibit their maximum sensitivity in a direction which is perpendicular to the plane of the substrate, and lies in the high refractive index medium, as is illustrated in FIG. 1 of the accompanying drawings. Hence, a possible structure which may be used with dielectric lenses of materials such as alumina (refractive index 3.1) is to fabricate the planar antennae as a photodefined array of evaporated metal bars on a slice of silicon, connected to a sensing and signal processing circuit manufactured in the silicon as illustrated in FIG. 2 of the accompanying drawings. The back of this circuit is pressed into close contact with the alumina lens as shown in FIG. 3 of the accompanying drawings. The silicon and alumina must be in very close contact, with a maximum permissible air gap of about 5 $\mu$m.

We have found that the structure illustrated in FIG. 3 is not always feasible if the lens material possesses a considerably higher refractive index (n equals approximately 6) than the silico (silicon n approximately equal to 3.4) If this is the case, it is necessary for the high refractive index material of the lens to be directly in contact with the metallisation of the antenna structure. Only very small air-gaps are permissible if the device structure is to be viable (of the order of 1 micron or less) and a pressed-contact structure of the type shown in FIG. 3 presents considerable difficulties in fabrication. Nevertheless, higher refractive index lenses present a number of advantages in that the wavelength of the radiation ($\lambda_n$) within the high refractive index is correspondingly shorter, as it is given by:

$$\lambda_n = \lambda_f / n$$

where $\lambda_f$ is the free space wave length, and n is the refractive index of the high refractive index material.

This means that, for a given frequency of operation, the antenna can be proportionately smaller, which in turn implies that a larger number of sensitive points can be fabricated per unit area of the array. Alternatively, the dielectric lens dimensions can also be reduced if a higher index material is employed thus resulting in a more compact system for a given array size.

SUMMARY OF THE INVENTION

One of the objects of the present invention is to provide an improved device structure which will considerably facilitate the fabrication of antenna array/microcircuit structures with high refractive index lenses.

According to the present invention there is provided a hybrid structure comprising a lens, an antenna array and an integrated circuit wherein the antenna array is formed on a surface of the lens or on a surface of a substrate having substantially the same refractive index as the lens material, means being provided for connecting the lens or substrate to spaced locations on the integrated circuit.

In a preferred embodiment of the present invention the antenna array is formed by photodefinition of a metal layer deposited (by, for example, evaporation, sputtering or from solution using a chemical or electrochemical process) directly onto the high refractive index material of which the lens or substrate is made.

In one embodiment of the present invention an electrical and mechanical connection is made between the antennae of the array and pre-defined bond pads formed on the semiconductor microcircuit.

In another embodiment a purely mechanical connection is made between the antennae of the array and the predefined bond pads on the semiconductor micorcircuit.

Preferably the electrical and/or mechanical connection between the antennae and the pre-defined bond pads are produced by using a metal-bump bonding technology, such as either the solder-bump or indium-bump technique.

BRIEF DESCRIPTION OF THE DRAWINGS

The present invention will be described further, by way of examples, with reference to the accompanying drawings in which.

DESCRIPTION OF THE PREFERRED EMBODIMENTS

Figure 4:
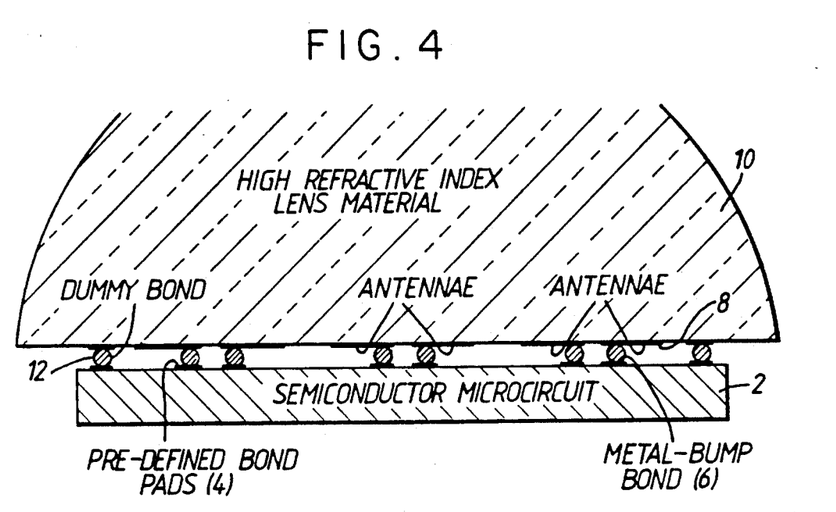
FIG. 4 is a schematic diagram illustrating a hybrid structure according to an embodiment of the present invention.

Referring to FIG. 4 a semiconductor microcircuit 2 is provided on one of its planar surfaces with eight spaced bond pads 4. Each of the bond pads 4 is bonded to a respective area of an antenna array 8 deposited on a planar surface of a high refractive index lens 10 by means of respective metal bump bonds 6.

Figure 5:
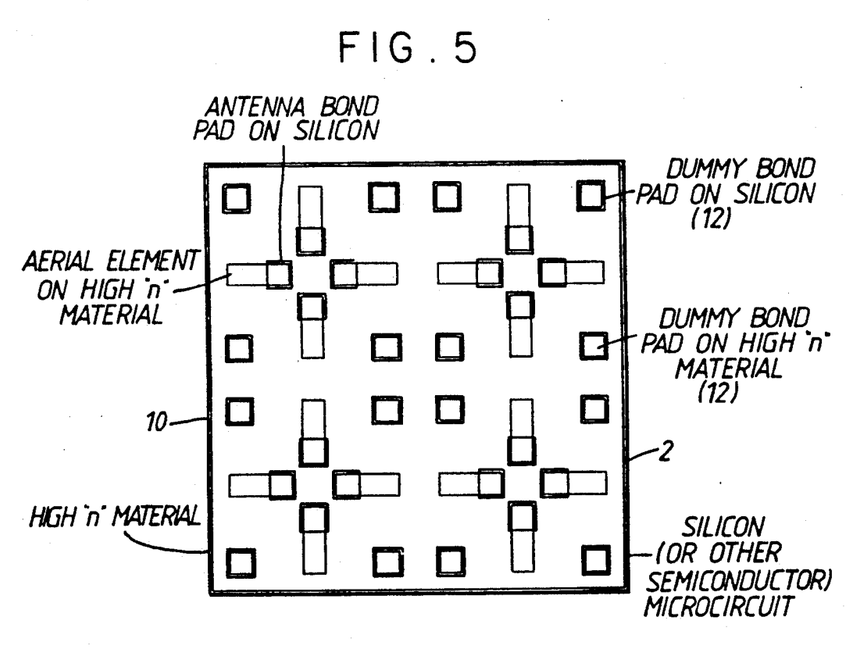
FIG. 5 is a plan view of the hybrid structure of FIG. 4.

As shown in FIG. 5, the design includes provision for a number of dummy bond elements 12 which are not connected to any circuits on the semiconductor. These provide extra mechanical support to the hybrid during assembly. Their exact positioning relative to the antenna structures is not critical and is most likely to be determined by the space requirements of the processing circuits.

Figure 6:
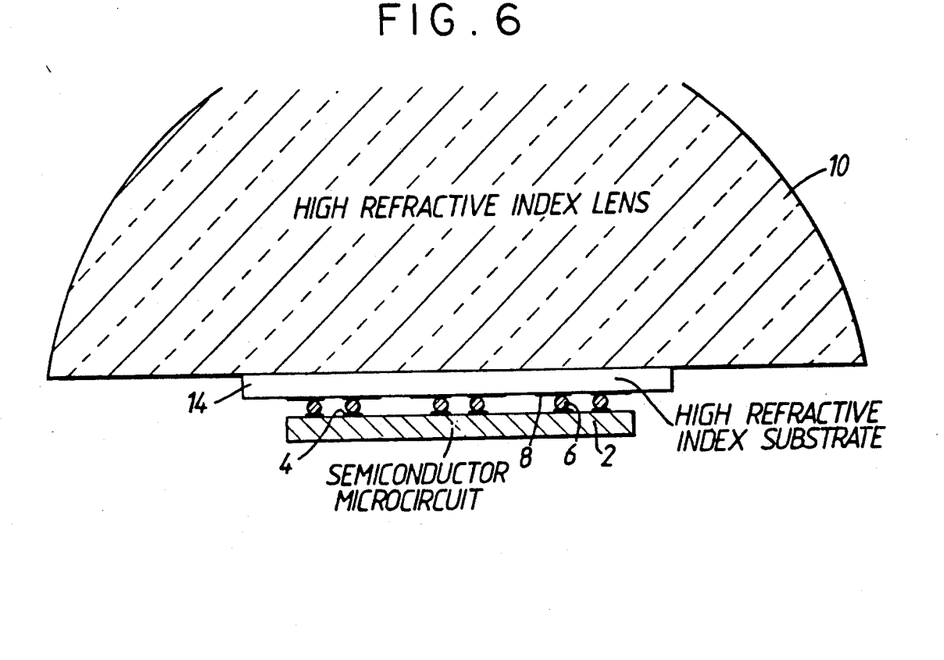
FIG. 6 is a schematic diagram illustrating a hybrid structure according to a second embodiment of the present invention.
Figure 7A:
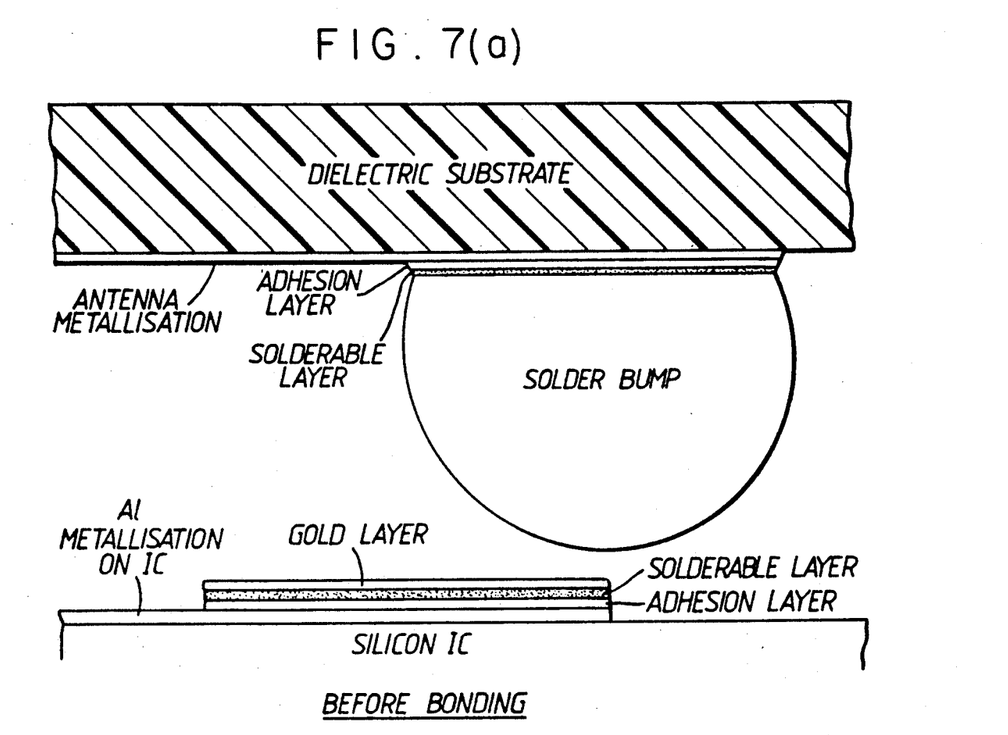
FIGS. 7(a) and 7(b) illustrate a solder bonding process suitable for use in fabricating the hybrid structures illustrated in FIGS. 4, 5, and 6, FIGS. 8(a) and 8(b) illustrate an indium bonding process suitable for use in fabricating the hybrid structures illustrated in FIGS. 4, 5, and 6, and FIGS. 9 and 10 are schematic diagrams of packaging arrangements for hybrid structures according to the present invention.
Figure 7B:
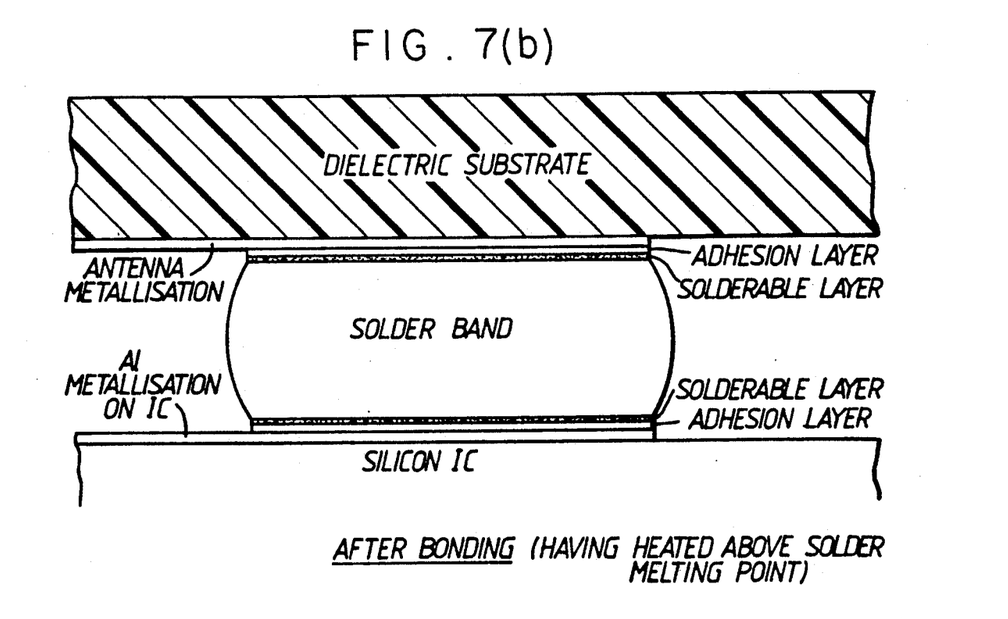
Figure 8A:
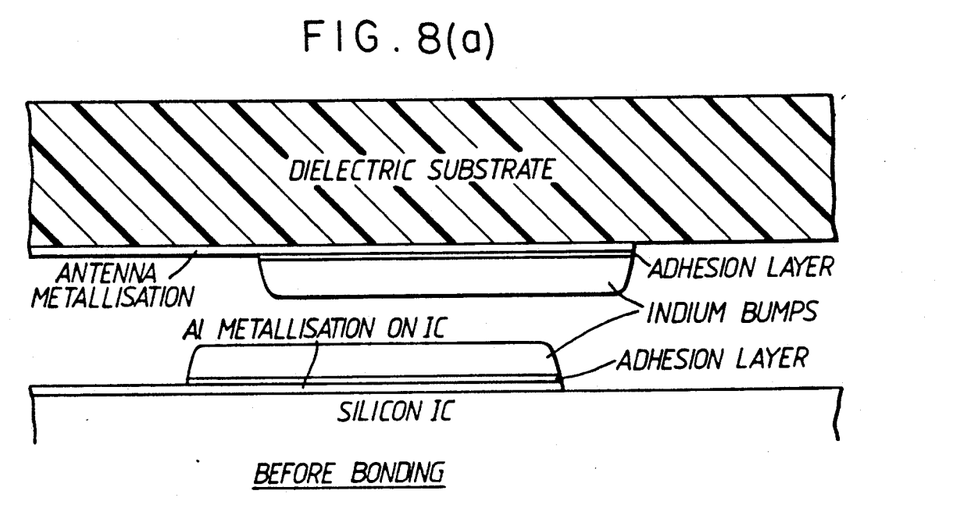
Figure 8B:
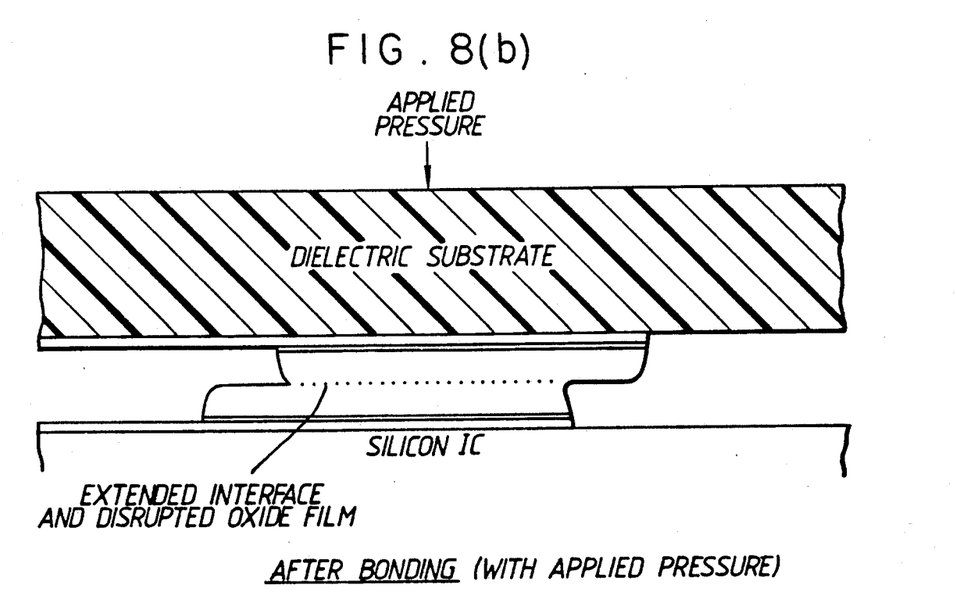

In another embodiment of the present invention the structure comprises a semiconductor microcircuit, a high refractive index substrate 14 and a high refractive index lens 10. Such a hybrid/lens structure is shown schematically in FIG. 6. The antenna structures are deposited first onto a thin, parallel sided high refractive index substrate made from the same material as the lens. This is first metal-bump bonded to the semiconductor microcircuit and then the hybrid is subsquently placed in close mechanical contact with the high refractive index lens. The substrate and the lens should be made of the same high refractive index material. Such an arrangement greatly facilitates the solder bump bonding operation and the subsequent build-up of an hermetically sealed package around the hybrid device as is described later.

Capacitive coupling between the defined antennae array on the high refractive index substrate and a matching array of antennae on the silicon integrated circuit is also provided by another embodiment of the present invention. In this case the solder bonds provide mechanical rather than electrical interconnection of the hybrid structure, the uniformly controlled solder bump height and inherent self aligning nature of the process being essential to effective capacitive coupling. In this embodiment the solder bonds may be located at any convenient points over the silicon IC surface, and not necessarily on the antennae. Indium bump bonding is not suitable for this embodiment.

There are two principal bonding techniques that may be employed to make the multiple electrical and mechanical connections between the dielectric lens or substrate and the silicon integrated circuit, namely solder bonding and indium bump bonding. The former technique involves a true soldering process in which the components are raised above the melting point of the selected solder to affect the bonding operation, whereas the latter technique relies upon the flow and cold welding behaviour of solid indium bumps deposited on the surfaces to be connected together under the application of mechanical pressure at ambient or slightly raised temperature. The former process presents a number of distinct advantages and is also compatible with the construction of an hermetic package around the hybrid device. The two bonding processes are illustrated schematically in FIG. 7 and 8.

An important first stage in either bonding process is usually the creation of an ohmic contact to the aluminium input pads on the silicon IC, and, if necessary, to the antenna metallisation on the dielectric material. In the former case this may be achieved by a process such as ion beam or sputter cleaning to remove a 6 nm oxide film on the aluminium input pads (breakdown strength about 1 volt), followed by the deposition of the appropriate metal layer in the same vacuum process operation. This metal is selected to provide good adhesion to the aluminium and also to act as a diffusion barrier to prevent interaction of subsequent layers (also deposited in the same vacuum process operation) with the aluminium. Metals such a chromium, titanium or nichrome (a Ni-Cr alloy) are suitable for this purpose. In the Indium bonding process this adhesion/diffusion barrier layer is immediately coated by a pad or bump of indium typically between 1 and 5 micron in thickness, whereas in the solder bonding process a solderable metal layer is deposited next (for example copper or nickel), which is then coated with a thin layer of gold. The gold layer acts to prevent tarnishing and corrosion of the solderable metal upon removal from the vacuum depostion plant and during subsequent processing. If copper is employed as the solderable metal, then it is important to ensure that there is a region of alloying between the barrier layer and the copper to prevent total dissolution of the copper when soldering which would then result in dewetting.

In the solder bonding process the selected solder is applied in a subsequent deposition process to an area usually somewhat greater than but overlapping that of the solderable metallisation. The solder may be applied by electrodeposition, if a continuous temporary layer is applied over the wafer surface with appropriate masking, or a thermal deposition process may be used to deposit the solder alloy constituents in sequence, for example electron beam evaporation using a thick resist float-off mask. After solder deposition, the solder is usually reflowed to allow the constituents, forming in the process an array of well-defined solder bumps.

In the indium bonding process the bond is effected by mechanically aligning the two components and then applying mechanical pressure (a few kg/mm$^2$) at ambient or somewhat raised temperature. Indium deforms readily by creep under such conditions, the indium oxide film at the surface is disrupted and a true metal bond is formed. The application of mechanical pressure is perhaps an undesirable feature of the process, but the creation of a sound bond at a low temperatures can be an advantage for some applications. However, the inherent lack of very accurate component alignment (probably not better than ±10 micron) and the relatively low melting point of indium (156° C.), which renders this process incompatible with hermetic packaging techniques, are disadvantages in the present case.

The solder bonding process, on the other hand, offers a major advantage in providing an inherent mechanism for the self alignment of the components during the actual solder bonding operation. The relatively high surface tension of the molten solder acts to eliminate any initial misalignment and thus produces a well-aligned hybrid structure. This self alignment action is effective provided good solderability is assured and the mass of the moveable component is not excessive. The bonding operation also involves no mechanical pressure. Solder alloys can be selected to provide a sufficiently high melting point to allow lower temperature solder to be employed in subsequent operations which are required to provide an hermetic seal around the device package window. For example a 95 wt. % lead 5% wt. % tin can be employed in the solder bumps (solidus 310° C., liquidus 314° C.), allowing a eutectic lead-tin alloy (63 wt. % tin —37 wt. %, eutectic temperature 183° C.) to be employed for solder sealing of the package lid.

The flip-chip bonded hybrid device structures described above with reference to FIGS. 4,5, and 6 require electrical connections to be made from the silicon chip, and to be encased and protected in an hermetic package that may be integrated with the dielectric lens. Two basic packaging concepts are provided by the present invention depending essentially upon the thermal power dissipation of the silicon IC chip, as illustrated in FIGS. 9 and 10.

Figure 9:
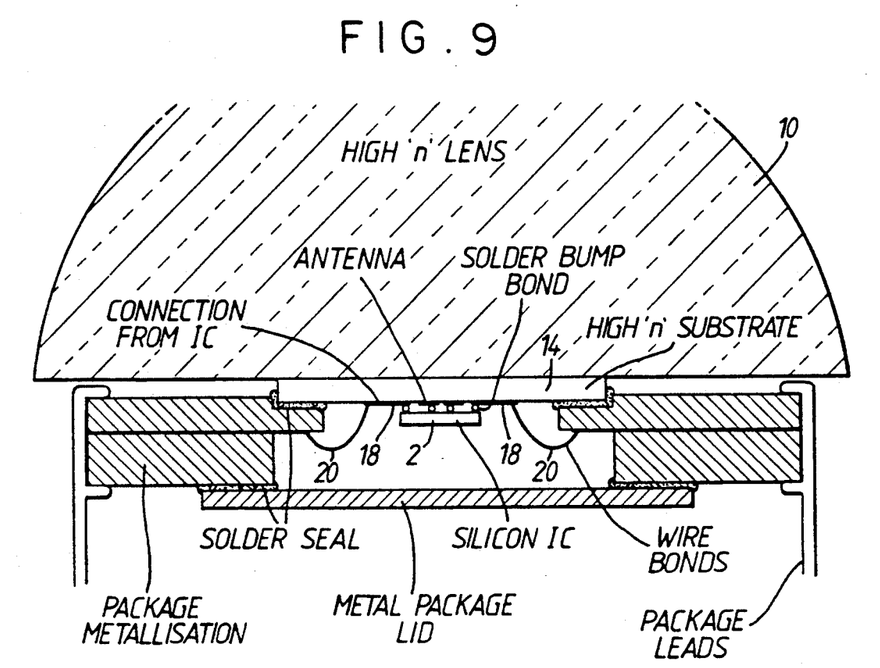

The package structure illustrated in FIG. 9 involves the flip-chip bonding of the silicon chip 2 onto the substrate 14 made of the high n material. The substrate 14 carries the antennae array 8 and also interconnection tracks fanning out from a position opposite the IC chip perimeter to the substrate perimeter. Solder bump connections are made between the antennae array 8 on the high n substrate 14 and the corresponding input pads on the IC chip 2. Solder bump connections are also made around the silicon chip perimeter to tracks 18 on the high n substrate in order to provide power to drive the IC chip 2 and to access processed signals. (Thus no wire bonds are made onto the silicon chip 2). The high n substrate, with its flip chipped silicon IC 2 bonded in place (using for example to 95-5 Pb-Sn solder alloy M.Pt. range 310°-314° C.), is then solder sealed into an appropriately metallised recess in the base of the package. This solder seal may best be effected using a lower melting point solder, for example a tin-silver eutectic solder (M.Pt. 221° C., 3.5 wt. % Ag), in order to avoid disturbing the solder bump bonds. Wire bond connections 20 are then made from the interconnection tracks on the high index substrate to the inner lead tracks of the package, which may be of a leaded or leadless variety. The package is completed by solder sealing a lid in place as shown, again employing a lower melting point solder. Localised heating may be required to affect this final seal without disruption of the substrate-to-package seal. The high n-substrate thickness and the package recess are designed so that the high n substrate is proud of the package base so that it may be held in intimate contact with the back of the high refractive index lens 10 (less than or equal to a 5 micron gap). This package style is perhaps most suitable where the silicon IC chip 2 dissipates relatively low power (less than or equal to approximately ½ watt), since the only effective thermal path from the silicon IC chip 2 is via the solder bump bonds. The typical thermal resistance of a single solder bump bond (95-5: PbSn) 100 micron diameters and 75 micron in height is about 270° C./watt, and the high index substrate, which is the next material in the thermal path, may not possess a high thermal conductivity.

Figure 10:
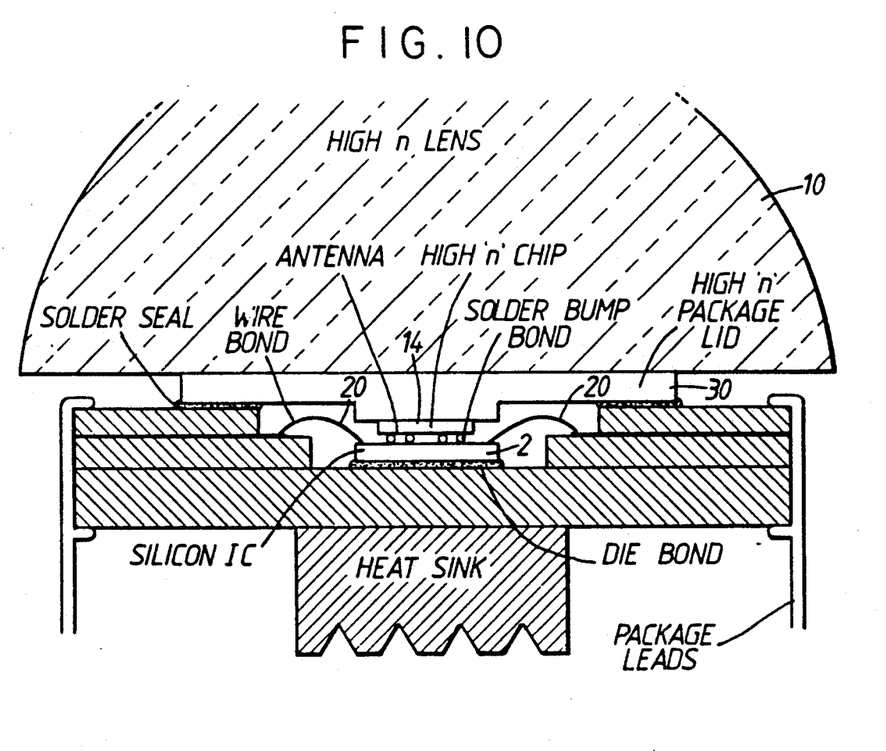

The package structure illustrated in FIG. 10 is, in effect, the reverse of that in FIG. 9 in that it involves the flip chip bonding of a small chip 14 of the high-n material onto the silicon IC chip 2. In this structure the chip of high-n material again carries the antennae array, but now device and access connections in and out of the silicon chip 2, are made conventionally by wire bonding. In assembly the high-n chip is first flip chip bonded onto the silicon chip using the 95:5 Pb:Sn solder. The resulting hybrid chip would then be bonded into the well of the package, using a method that does not disturb the solder bonds (e.g. SLID bonding, or epoxy die attach). Wire bond connections 20 are then made from the silicon chip to the inner package leads. The package is completed by solder sealing a high n package lid 30 in place using a lower melting point solder alloy. During this operation, the high n package lid 30, which possesses a central flat projection, is held against the surface of the high n chip 14 so that, after package sealing, a very small gap is maintained between the two high n components. A gap of up to about 5 microns may be tolerated provided the high n chip is more than about 200 microns in thickness i.e. that the gap is more than 200 microns from the antennae array. This package structure does allow for efficient heat transfer from the silicon IC chip 2 and hence a greater power dissipation level may be accepted. Indeed in this structure heat sinks may be simply attached to the base of the package to aid heat dissipation. In operation the assembled package, with the high n material lid standing proud, is held in intimate contact with the back of the high index lens 10.

We claim:

1. A hybrid structure comprising a lens, an antenna array and an integrated circuit wherein the antenna array is formed on a surface of the lens or on a surface of a substrate having substantially the same refractive index as the lens material, means being provided for connecting the lens or substrate to spaced locations on the integrated circuit.

2. A hybrid structure as claimed in claim 1 wherein the antenna array is formed by photodefinition of a metal layer deposited directly onto the high refractive index material of which the lens or substrate is made.

3. A hybrid structure as claimed in claim 1 wherein connections are provided between the antennae of the array and pre-defined bond pads formed on the semiconductor microcircuit of the integrated circuit.

4. A hybrid structure as claimed in claim 3 wherein at least one of the connections provide an electrical connection between the antennae and the semiconductor microcircuit, and at least one of the connections serve as a mechanical supporting connection.

5. A hybrid structure as claimed in claim 3 wherein all of the connections between the antennae of the array and the pre-defined bond pads of the semiconductor microcircuit provide a mechanical supporting function, the antenna of the array and the semiconductor microcircuit being arranged to be capacitively coupled when in operation.

6. A hybrid structure as claimed in any one of claim 3 wherein the connections have been produced using a metal-bump bonding technique.

7. A hybrid structure as claimed in claim 6 wherein a solder-bump technique has been utilized.

8. A hybrid structure as claimed in claim 6 wherein an indium-bump technique has been utilized.

9. A hybrid structure comprising a lens, an antenna array and an integrated circuit, wherein the antenna array is formed on a substrate material having a higher refractive index than the substrate material in which the integrated circuit is formed.

* * * * *